(12) United States Patent
Shimizu et al.

(10) Patent No.: US 7,692,375 B2
(45) Date of Patent: Apr. 6, 2010

(54) ORGANIC LIGHT EMITTING DISPLAY APPARATUS

(75) Inventors: Masao Shimizu, Hitachi (JP); Hajime Murakami, Tokyo (JP); Sukekazu Aratani, Hitachiota (JP); Masahiro Tanaka, Chiba (JP)

(73) Assignee: Hitachi Displays, Ltd. (JP)

( * ) Notice: Subject to any disclaimer, the term of this patent is extended or adjusted under 35 U.S.C. 154(b) by 825 days.

(21) Appl. No.: 11/407,061

(22) Filed: Apr. 20, 2006

(65) Prior Publication Data

US 2006/0238111 A1      Oct. 26, 2006

(30) Foreign Application Priority Data

Apr. 22, 2005   (JP) ............................. 2005-124405

(51) Int. Cl.
*H05B 33/00*   (2006.01)
(52) U.S. Cl. ........................................ 313/504; 313/506
(58) Field of Classification Search .................. None
See application file for complete search history.

(56) References Cited

U.S. PATENT DOCUMENTS 6,452,341 B1 *   9/2002   Yamauchi et al. ......... 315/169.1
7,057,208 B2 *   6/2006   Akimoto et al. ............... 257/59

FOREIGN PATENT DOCUMENTS

| JP | 2001-093666 | 4/2001 |
| JP | 2002-198182 | 7/2002 |
| JP | 2003-272867 | 9/2003 |

* cited by examiner

*Primary Examiner*—Ashok Patel
(74) *Attorney, Agent, or Firm*—Antonelli, Terry, Stout & Kraus, LLP.

(57) ABSTRACT

An object of the present invention is to provide an organic light emitting element having a high efficiency and a high quality in which electron and hole injection efficiency of an electrode is reproduced in an insulated or contaminated first electrode. In an organic light emitting display apparatus, a substrate, a first electrode, an insulation film bank formed so as to cover edges of the first electrode, a metal thin film formed on the first electrode and the insulation film bank, an organic light emitting layer, and a second electrode are disposed in the cited order. A lower part of a side face of the insulation film bank takes a reverse tapered shape.

6 Claims, 5 Drawing Sheets

|  | CROSSTALK | LUMINANCE (cd/mm$^2$) at 7V |
|---|---|---|
| SECOND EMBODIMENT | DOES NOT OCCUR | 1500 |
| FIRST COMPARATIVE EXAMPLE | OCCURS | 700 |

| | LUMINANCE (cd/mm$^2$) at 7V |
|---|---|
| SIXTH EMBODIMENT | 1550 |
| SECOND COMPARATIVE EXAMPLE | 0 (LIGHT IS NOT EMITTED) |

ORGANIC LIGHT EMITTING DISPLAY APPARATUS

BACKGROUND OF THE INVENTION

The present invention relates to an organic light emitting element and a display apparatus using such an element.

In an active matrix organic light emitting display apparatus, two to four drive elements including thin film transistor switching elements and capacitance are connected to an organic light emitting element which forms each pixel. Thus, all pixels can be turned on over one frame period. As a result, it is not necessary to raise the luminance and it becomes possible to prolong the life of the organic light emitting element. Therefore, it is considered that the active matrix organic light emitting display apparatus is advantageous to a larger screen with higher definition.

On the other hand, in an organic light emitting display apparatus in which emitted light is taken out from the back side of a substrate, an aperture ratio is limited provided that an active matrix having a drive unit between the substrate and organic light emitting elements is used. Especially in a large-sized display, there is a problem that it is necessary to widen the width of a power supply line in order to reduce the luminance variation between pixels caused by a voltage drop on the power supply line and the aperture ratio becomes extremely small.

An active matrix type organic light emitting display apparatus having an upper electrode made transparent and a structure for taking out emitted light from the upper electrode side, i.e., having a top emission structure is considered to be effective to solve the problem. In this apparatus, there is no drive unit on the upper electrode for taking out emitted light, and consequently the aperture ratio can be improved by leaps and bounds.

A technique of forming a thin film layer for hole injection having a large work function between an anode and an organic layer in order to improve light emission characteristics by increasing a hole current in an organic light emitting element having such a top emission structure is described in JP-A-2002-198182. A technique of forming an electron injection layer between a cathode and an organic layer is described in JP-A-2003-272867.

FIG. 9 shows a single pixel sectional view of an organic light emitting element having a top emission structure. In this organic light emitting element, a first electrode 115 serves as a cathode and a second electrode 125 serves as an anode. The element has a lamination structure including the first electrode 115, an electron injection layer 124, an electron transportation layer 123, a light emission layer 122, a hole transportation layer 121, a hole injection layer 129, a second electrode 125 and a protection layer 126.

The manufacturing process of the element having the top emission structure will now be studied. The first electrode 115 is patterned by wet etching or the like in a photolithography process. At this time, the surface is insulated or contaminated. If an electron injection layer is formed on the insulated or contaminated first electrode 115 in this case, the light emission efficiency falls or light is not emitted, resulting in a problem of lowered lighting reliability. Also in an element having a structure reversed in anode and cathode positions, this problem occurs in the same way.

According to JP-A-2002-198182 and JP-A-2003-272867, the electron injection layer or the thin film layer for hole injection is formed between the anode and the organic layer. However, it does not function to reproduce the efficiency of injection into the electron injection layer or the hole injection layer in the insulated or contaminated first electrode. The problem is not solved.

SUMMARY OF THE INVENTION

An object of the present invention is to provide an organic light emitting element having a high efficiency and a high quality in which electron and hole injection efficiency of the electrode is reproduced.

Hereafter, means for solving the problems in the present invention will be described.

In a configuration of an organic light emitting display apparatus according to the present invention, a substrate, a first electrode, an insulation film bank formed so as to cover edges of the first electrode, a metal thin film formed on the first electrode and the insulation film bank, an organic light emitting layer, and a second electrode are disposed in the cited order, and a lower part of a side face of the insulation film bank takes a reverse tapered shape. In a configuration of an organic light emitting display apparatus, a substrate, a first electrode, an insulation film bank formed so as to cover edges of the first electrode, a metal thin film formed on the first electrode and the insulation film bank, an organic light emitting layer, and a second electrode are disposed in the cited order, and a side face of the insulation film bank includes a regular tapered part and a reverse tapered shape. In a configuration, the side face of the insulation film bank has a reverse tapered shape on a side located near the first electrode and has a regular tapered shape on a side located far from the first electrode. In a configuration, the side face having the reverse tapered shape is at a height in a range of 0.3 to 200 nm from the first electrode. In a configuration, an electron transportation layer is disposed between the metal thin film and the organic light emitting layer, and a hole transportation layer is disposed between the organic light emitting layer and the second electrode. In a configuration, an electron injection layer is disposed between the metal thin film and the electron transportation layer. In a configuration, the metal thin film is a conductive film having a work function equal to or less than a work function of the first electrode. In a configuration, a hole transportation layer is disposed between the metal thin film and the organic light emitting layer, and an electron transportation layer is disposed between the organic light emitting layer and the second electrode. In a configuration, a hole injection layer is disposed between the metal thin film and the hole transportation layer. In a configuration, the metal thin film is a conductive film having a work function that is equal to at least a work function of the first electrode. In a configuration, a film thickness of the metal thin film is equal to two thirds or less of a height of the side face having the reverse tapered shape measured from the first electrode.

As for the insulation film bank in which regular bank is formed, in the present invention, only a lower part of the slope of the insulation film bank covering the first electrode edges is provided with a reverse tapered shape under an optimum condition of reverse sputtering, plasma etching, ion beaming or wet etching. The metal thin film is formed on the first electrode and the insulation film bank, and the metal thin film divided every pixel is obtained. As a result, crosstalk with adjacent pixels can be prevented, and the efficiency of injection of electrons and holes from the first electrode can be improved. The material of the metal thin film is not especially restricted. Two or more kinds of materials may be used together. The film thickness of the metal thin film is one hundred and several tens nm or less. It is not necessary to set the reverse taper height h of the insulation film bank equal to at least 201 nm.

The organic light emitting element includes the electron transportation layer, the organic light emitting layer, the hole transportation layer, the hole injection layer, the first electrode and the second electrode. As for the hole injection layer, a material having a suitable ionizing potential is desirable to lower the injection barrier of the anode and the hole transportation layer. Furthermore, it is desirable that the material plays a role of burying the unevenness of the surface of the underlying layer. Specifically, steel phthalocyanine, star burst amine compound, polyaniline and polythiophene can be mentioned. However, the material is not restricted to them.

The hole transportation layer plays a role of transporting holes and injecting the holes into the light emitting layer. Therefore, it is desirable that the hole mobility is high. Furthermore, it is desirable that the hole transportation layer is chemically stable. It is also desirable that the ionizing potential is low. It is also desirable that the electron affinity is low. It is also desirable that glass transition temperature is high. Specifically, N,N'-bis(3-methylphenyl)-N,N'-diphenyl-[1,1'-biphenyl]-4,4'-diamine (hereafter abbreviated to TPD), 4,4'-bis[N-(1-naphtyl)-N-phenylamino]biphenyl (hereafter abbreviated to α-NPD), 4,4',4"-tri(N-carbazolyl)triphenylamine (hereafter abbreviated to TCTA), and 1,3,5-tris[N-(4-diphenyl aminophenyl)phenylamino]benzene (hereafter abbreviated to p-DPA-TDAB) are desirable. Of course, the material is not restricted to these materials. Two or more kinds included in these materials may be used together.

The light emitting layer means a layer in which electrons are recombined and light is emitted with a wavelength peculiar to the material. In some cases, the host material forming the light emitting layer emits light. In other cases, a dopant material added to the host by a minute quantity emits light. As the concrete host material, a distyrylarylene derivative (hereafter abbreviated to DPVBi), a silole derivative having a benzene ring in its framework (hereafter abbreviated to 2PSP), an oxadiazole derivative having a triphenylamine structure on both ends (hereafter abbreviated to EM2), a berinone derivative having a phenanthrene group (hereafter abbreviated to P1), an oligothiophene derivative having a triphenylamine structure on both ends (hereafter abbreviated to BMA-3T), a berylene derivative (hereafter abbreviated to tBu-PTC), tris(8-quinolinol) aluminum (hereafter abbreviated to Alq), a polyparaphenylenevinylene derivative, a polythiophene derivative, a polyparaphenylene derivative, a polysilane derivative, and a polyacetylene derivative are desirable. Of course, the material is not restricted to these materials. Two or more kinds included in these materials may be used together.

As a concrete dopant material, quinacridon, coumarin 6, nile red, ruprene, 4-(dicyanomethylene)-2-methyl-6-(para-dimethylaminostyryl)-4H-pyran (hereafter abbreviated to DCM), and a dicarbazor derivative are desirable. Of course, the material is not restricted to these materials. Two or more kinds included in these materials may be used together.

The electron transportation layer plays a role of transporting electrons and injecting electrons into the light emitting layer. Therefore, it is desirable that the electron mobility is high. Specifically, Alq, an oxadiazole derivative, a silole derivative, and a zinc benzothiazole complex are desirable. Of course, the material of the electron transportation layer is not restricted to these materials. Two or more kinds included in these materials may be used together.

The electron injection layer is used to improve the efficiency of injection of electrons from the cathode into the electron transportation layer. Specifically, lithium fluoride, magnesium fluoride, calcium fluoride, strontium fluoride, barium fluoride, magnesium oxide and aluminum oxide are desirable. Of course, the material of the electron injection layer is not restricted to these materials. Two or more kinds included in these materials may be used together.

The metal thin film is used to reproduce the efficiency of injection of electrons or holes from the cathode or anode contaminated by wet etching or the like into the electron injection layer or the hole injection layer. The material of the metal thin film differs depending upon the structure of the organic light emitting element.

In a first configuration, the first electrode functions as the cathode and the second electrode functions as the anode. The first electrode, the metal thin film, the hole injection layer, the hole transportation layer, the light emitting layer, the electron transportation layer, the electron injection layer, and the second electrode are laminated in the cited order. In this configuration, a structure that does not have an electron injection layer or a hole injection layer is also conceivable. Furthermore, a structure that does not have an electron transportation layer or a hole transportation layer is also conceivable.

As for the material of the metal thin film in this case, a conductive film having a large work function is desirable in order to raise the efficiency of injection of holes into the hole injection layer. Specifically, metal such as molybdenum, nickel or chrome, an alloy using these metals, and an inorganic material such as polysilicon, amorphous silicon, tin oxide, indium oxide, indium tin oxide (ITO), vanadium oxide and a tungsten oxide can be mentioned. However, the material is not restricted to these materials. Two or more kinds included in these materials may be used together. Furthermore, it is not prevented to use the same material as that of the first electrode.

On the other hand, in a configuration, the first electrode functions as the cathode and the second electrode functions as the anode. The first electrode, the metal thin film, the electron injection layer, the electron transportation layer, the light emitting layer, the hole transportation layer, the hole injection layer, and the second electrode are laminated in the cited order. In the above-described configuration, a structure that does not have the electron injection layer or the hole injection layer is also conceivable. A structure that does not have the electron transportation layer or the hole transportation layer is also conceivable. As for the material of the metal thin film in this case, a conductive film having a small work function is desirable in order to increase the efficiency of injection of electrons into the electron injection layer. Specifically, metal such as aluminum, silver, magnesium or metal calcium, an alloy using these metals, an oxide containing a cerium compound or indium oxide as a principal material, a vanadium oxide, a tungsten oxide, and a lithium organic matter can be mentioned. The material is not restricted to these materials. Two or more kinds included in these materials may be used together. Furthermore, it is not prevented to use the same material as that of the first electrode.

As for the material used for the first electrode, an electrode material is desirable. Specifically, metal such as aluminum, silver, copper, molybdenum, nickel or chrome, an alloy using these metals, or an inorganic material such as a cerium compound, polysilicon, amorphous silicon, tin oxide, indium oxide, indium tin oxide (ITO) can be mentioned. However, the material is not restricted to these materials.

If an $In_2O_3$—$SnO_2$ conductive film is fabricated by using the sputtering method under the condition that the substrate temperature is raised to approximately 200° C., the polycrystal state is brought about. In the polycrystal state, the etching rate in the crystal grain differs from that at an interface of the crystal grain. When the $In_2O_3$—$SnO_2$ conductive film is used for the first electrode, therefore, the amorphous state is desirable.

As for a material used for the second electrode, an oxide using indium oxide as its principal material can be mentioned. In particular, an $In_2O_3$—$SnO_2$ transparent conductive film and an $In_2O_3$—$ZnO$ transparent conductive film are desirable. As for the manufacturing method of the transparent conductive film, the sputtering method, EB deposition method, and ion plating method can be mentioned.

As another means of the present invention, in a configuration of an organic light emitting display apparatus, a substrate, a first electrode, an insulation film bank formed so as to cover edges of the first electrode, a metal thin film formed on the first electrode and the insulation film bank, an organic light emitting layer, and a second electrode are disposed in the cited order, and a part of a top face of the insulation film bank takes an uneven shape. In a configuration, the uneven shape has center line average roughness in a range of 1 to 1000 nm. In a configuration, the metal thin film has a film thickness that is half or less of the center line average roughness. In a configuration, the uneven shape has a convex part taking a shape of a cone, a pyramid, a dome, a column or a pillar that is at least 1 nm in height. In a configuration, the metal thin film has a film thickness that is equal to half or less of the height of the convex part taking the shape of a cone, a pyramid, a dome, a column or a pillar.

In the present invention, on the top of the insulation film bank formed using a film forming method such as spin coating, chemical vapor deposition method, sputtering or ion plating, a minute uneven surface is obtained under an optimum condition of reverse sputtering, plasma etching, ion beaming or wet etching. The metal thin film is formed on the first electrode and the insulation film bank, and the metal thin film divided every pixel is obtained. As a result, crosstalk with adjacent pixels is prevented, and the efficiency of injection of electrons and holes from the first electrode can be improved. As for the metal thin film, the material is not especially restricted. Two or more kinds of material may be used together. The film thickness of the metal thin film is in the range of 0.5 to 500 nm. For dividing the metal thin film every pixel, it is necessary to set the center line average roughness of the top surface of the insulation film bank to a value in the range of 1 to 1000 nm.

On the top of the insulation film bank, an uneven surface taking a shape of a cone, a pyramid, a dome, a column or a pillar is obtained under an optimum condition of a film forming method such as sputtering, chemical vapor deposition or ion plating. The metal thin film is formed on the first electrode and the insulation film bank, and the metal thin film divided every pixel is obtained. As a result, crosstalk with adjacent pixels is prevented, and the efficiency of injection of electrons and holes from the first electrode can be improved. As for the metal thin film, the material is not especially restricted. Two or more kinds of material may be used together.

Since the metal thin film is prevented from being formed on the top of the insulation film bank by using a shadow mask, the metal thin film divided every pixel is obtained. As a result, crosstalk with adjacent pixels is prevented, and the efficiency of injection of electrons and holes from the first electrode can be improved.

In this organic light emitting display apparatus, the metal thin film may be formed of an electrode material. In this case, the efficiency of injection of electrons and holes can be reproduced by forming the metal thin film on the first electrode and the insulation film bank slope contaminated by wet etching or the like in the photolithography process. The electrode material is metal such as aluminum, silver, copper, molybdenum, tungsten, nickel or chrome, an alloy using these metals, or an inorganic material such as a cerium compound, polysilicon, amorphous silicon, tin oxide, indium oxide, indium tin oxide (ITO). Two or more kinds included in these materials may be used together.

In the present invention, the film thickness range of the metal thin film is prescribed. The film thickness of the metal thin film is set equal to two thirds or less of a height h of reverse taper of a lower part of the insulation film bank slope so as to divide the metal thin film every pixel on the reverse tapered insulation film bank forming a reverse tapered angle θ of 90 degrees or less with the exposed first electrode face and having a height h in the range of 0.3 to 200 nm.

In a configuration, the film thickness of the metal thin film is half or less of center line average roughness of the top surface of the insulation film bank. In the present invention, the film thickness of the metal thin film is made half or less of center line average roughness of the top surface of the insulation film bank so as to divide the metal thin film every pixel on an uneven surface having center line average roughness in the range of 1 to 1000 nm on the top of the insulation film bank.

In a configuration, the thickness of the metal thin film is half or less of the height of a convex part taking a shape of a cone, a pyramid, a dome, a column or a pillar on the top surface of the insulation film bank. In the present invention, the thickness of the metal thin film is made half or less of the height of a convex part taking a shape of a cone, a pyramid, a dome, a column or a pillar on the top surface of the insulation film bank so as to divide the metal thin film every pixel on an uneven surface where the height of a convex part taking a shape of a cone, a pyramid, a dome, a column or a pillar is at least 1 nm.

In a configuration of the organic light emitting display apparatus, a plurality of pixels and thin film transistors for driving the pixels are included, and the organic light emitting display apparatus is active matrix type. In a configuration, the thin film transistors are polysilicon thin film transistors or amorphous silicon thin film transistors.

As another means of the present invention, in a configuration of an organic light emitting display apparatus, a substrate, a first electrode, an insulation film bank formed so as to cover edges of the first electrode, a metal thin film formed on the first electrode and the insulation film bank, an electron transportation layer, an organic light emitting layer, a hole transportation layer, and a second electrode are disposed in the cited order, and the metal thin film is a conductive film having a work function equal to or less than a work function of the first electrode.

As another means of the present invention, in a configuration of an organic light emitting display apparatus, a substrate, a first electrode, an insulation film bank formed so as to cover edges of the first electrode, a metal thin film formed on the first electrode and the insulation film bank, a hole transportation layer, an organic light emitting layer, an electron transportation layer, and a second electrode are disposed in the cited order, and the metal thin film is a conductive film having a work function that is equal to at least a work function of the first electrode.

Owing to the high efficiency in the light emitting part obtained by using polysilicon thin film transistors, the pixel voltage becomes low and the reliability of the pixel circuit can be improved. Since the pixel voltage can be made low, the pixel power supply can be small-sized. Furthermore, because of prevention of crosstalk between a light emitting part and adjacent pixels and high efficiency obtained by using amorphous silicon thin film transistor, the current driven by the thin film transistor decreases and the shift of the threshold voltage of the thin film transistor decreases.

According to the present invention, it is possible to reproduce the efficiency of injection of electrons and holes from the electrode. As a result, it becomes possible to provide an organic light emitting element having a high efficiency and a high quality.

Other objects, features and advantages of the invention will become apparent from the following description of the embodiments of the invention taken in conjunction with the accompanying drawings.

DESCRIPTION OF THE EMBODIMENTS

Hereafter, embodiments of the present invention will be described.

First Embodiment

Figure 1:
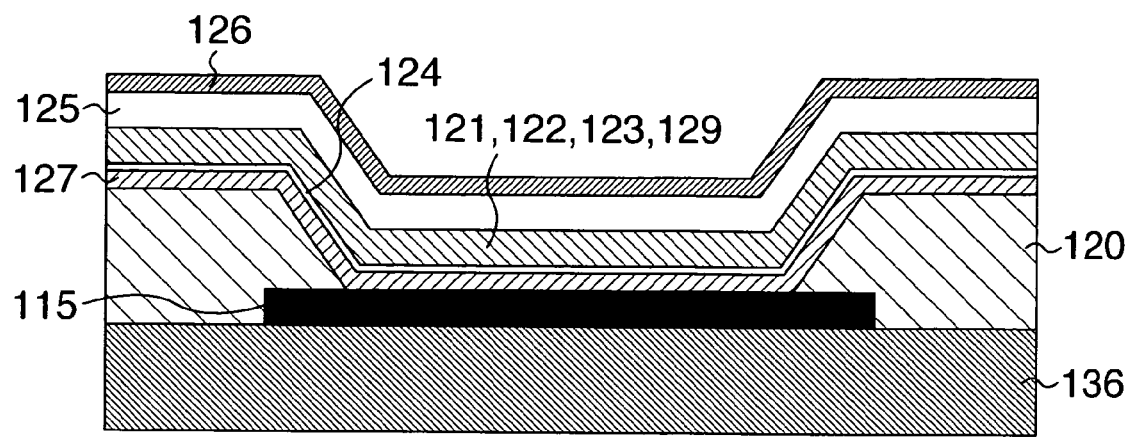
FIG. 1 is an enlarged sectional view of a pixel region in an organic light emitting display apparatus showing a first embodiment of the present invention.
Figure 9:
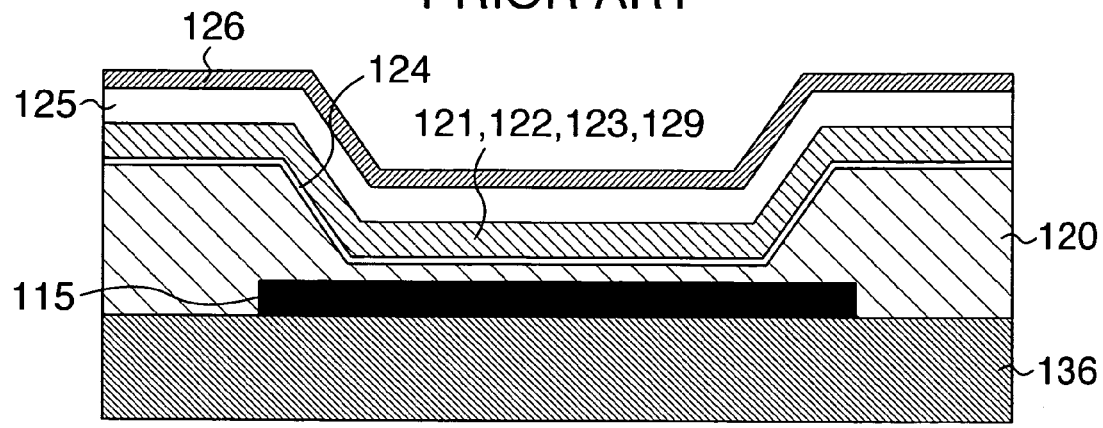
FIG. 9 is an enlarged sectional view of a pixel region in a conventional organic light emitting display apparatus.

FIG. 1 shows a first embodiment of the present invention. This configuration differs from the element configuration shown in FIG. 9 in that a metal thin film 127 is disposed between a first electrode 115 or an insulation film bank 120 and an electron injection layer 124. The metal thin film 127 is formed on the first electrode 115 and the insulation film bank 120 by using the vacuum deposition method.

An electron transportation layer 123 plays a role of transporting electrons and injecting electrons into a light emitting layer. Therefore, it is desirable that the electron mobility is high. Specifically, Alq, an oxadiazole derivative, a silole derivative, and a zinc benzothiazole complex are desirable. Of course, the material of the electron transportation layer is not restricted to these materials. Two or more kinds included in these materials may be used together.

The electron injection layer 124 is used to improve the efficiency of injection of electrons from a cathode into the electron transportation layer. Specifically, lithium fluoride, magnesium fluoride, calcium fluoride, strontium fluoride, barium fluoride, magnesium oxide and aluminum oxide are desirable. Of course, the material of the electron injection layer is not restricted to these materials. Two or more kinds included in these materials may be used together.

The metal thin film 127 is used to reproduce the efficiency of injection of electrons from the cathode contaminated by wet etching or the like into the electron injection layer. The material of the metal thin film 127 differs depending upon the structure of the organic light emitting element.

In the configuration shown in FIG. 1, the first electrode 115 functions as the cathode, and a second electrode 125 functions as the anode. The element has a lamination structure including the first electrode 115, the metal thin film 127, the electron injection layer 124, the electron transportation layer 123, a light emitting layer 122, a hole transportation layer 121, a hole injection layer 129 and the second electrode 125. In this configuration, a structure that does not have an electron injection layer or a hole injection layer is also conceivable. Furthermore, a structure that does not have an electron transportation layer or a hole transportation layer is also conceivable. As for the metal thin film 127 in this case, a conductive film having a small work function is desirable in order to raise the efficiency of injection of electrons into the electron injection layer 124. Specifically, metal such as aluminum, silver, magnesium or metal calcium, an alloy using these metals, an oxide containing a cerium compound or indium oxide as a principal material, a vanadium oxide, a tungsten oxide, and a lithium organic matter are desirable. Two or more kinds included in these materials may be used together. Furthermore, it is not prevented to use the same material as that of the first electrode 115.

By assuming the configuration described heretofore, it is possible to reproduce the efficiency of injection of electrons from the first electrode 115 contaminated by wet etching or the like into the electron injection layer 124.

On the other hand, also in a configuration having the first electrode 115 as the anode and the second electrode 125 as the cathode, the present invention can be used in the same way. In this case, the element has a lamination structure including the first electrode 115, the metal thin film 127, the hole injection layer 129, the hole transportation layer 121, the light emitting layer 122, the electron transportation layer 123, the electron injection layer 124 and the second electrode 125. In this configuration as well, a structure that does not have an electron injection layer or a hole injection layer is also conceivable. Furthermore, a structure that does not have an electron transportation layer or a hole transportation layer is also conceivable. As for the material of the metal thin film 127 in this case, a conductive film having a large work function is desirable in order to raise the efficiency of injection of holes into the hole injection layer 129. Specifically, metal such as molybdenum, nickel or chrome, an alloy using these metals, and an inorganic material such as polysilicon, amorphous silicon, tin oxide, indium oxide, indium tin oxide (ITO), vanadium oxide and a tungsten oxide are desirable. Two or more kinds included in these materials may be used together. Furthermore, it is not prevented to use the same material as that of the first electrode 115.

By assuming the configuration described heretofore, it is possible to reproduce the efficiency of injection of holes from the first electrode 115 contaminated by wet etching or the like into the hole injection layer 129.

Second Embodiment

Figure 2:
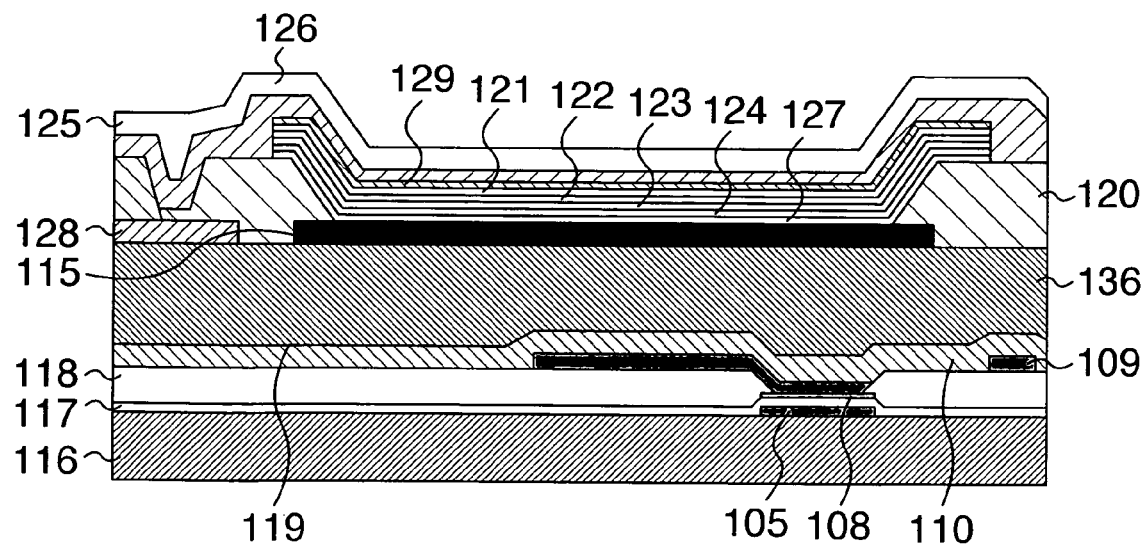
FIG. 2 is a sectional view of a pixel region in an organic light emitting display apparatus.

A second embodiment of the present invention will now be described with reference to FIGS. 2 to 4.

If the first embodiment is used, a problem that contact with the first electrode or the second electrode and short circuit to an adjacent pixel occur is caused. In the present embodiment, a configuration in which the metal thin film is formed discontinuously is used.

First, a method for manufacturing the organic light emitting display apparatus in this embodiment will now be described. Thin film transistors are polysilicon thin film transistors. FIG. 2 is a sectional view of a pixel region in the organic light emitting display apparatus. An amorphous silicon (a-Si) film having a film thickness of 50 nm is formed on a glass substrate 116 by using the low pressure chemical vapor deposition method (LPCVD method). Subsequently, the whole surface of the film is subjected to laser annealing. As a result, a-Si is crystallized to form polycrystalline silicon (p-Si). Subsequently, the p-Si film is patterned using dry etching to form an active layer of a first transistor, an active layer of a second transistor, and a capacitance lower electrode 105. Subsequently, a $SiO_2$ film having a film thickness of 100 nm is formed as a gate insulation film 117 by using the plasma enhanced chemical vapor deposition method (PECVD method). Subsequently, a TiW film having a film thickness of 50 nm is fabricated as a gate electrode by using the sputtering method, and is patterned. In addition, a scanning line and a capacitance upper electrode 108 are patterned. Subsequently, P ions are injected from the top of the gate insulation film 117 into the patterned p-Si layer. P ions are not injected into a region over which a gate electrode is provided, and the region becomes a channel region. Subsequently, the substrate 116 is subjected to heating processing in an $N_2$ atmosphere, and impurities (P) are activated to form an impurity active region. Over the impurity active region, a $SiN_2$ film is formed as a first interlayer insulation film 118. The film thickness is 200 nm. Subsequently, a contact hole is formed through the gate insulation film 117 and the first interlayer insulation film 118 in the impurity active region. In addition, a contact hole is formed through the first interlayer insulation film 118 over the gate electrode of the second transistor.

On the first interlayer insulation film 118, an Al film having a film thickness of 500 nm is formed by using the sputtering method. A signal line 109 and a first current supply line 110 are formed by a photolithography process. Furthermore, a source electrode and a drain electrode of the first transistor and a source electrode and a drain electrode of the second transistor are formed. The capacitance lower electrode 105 is connected to the drain electrode of the first transistor. Furthermore, the source electrode of the first transistor is connected to the signal line 109. The drain electrode of the first transistor is connected to the gate electrode of the second transistor. The drain electrode of the second transistor is connected to the first current supply line 110. The capacitance upper electrode 108 is connected to the first current supply line 110. As for a second interlayer insulation film 119, a SiNx film is formed using the plasma enhanced chemical vapor deposition method (PECVD method). The film thickness is 500 nm. A contact hole is provided in an upper part of the drain electrode of the second transistor.

Figures 3, 4:
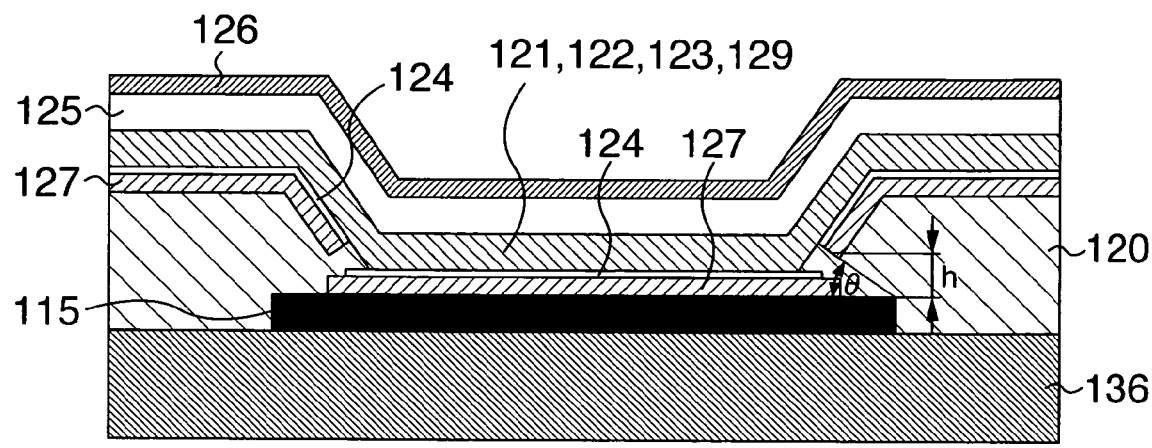
FIG. 3 is an enlarged sectional view of a pixel region in an organic light emitting display apparatus showing a second embodiment of the present invention.
FIG. 4 is a Table showing a result obtained by evaluating light emission luminance of elements in organic light emitting apparatuses fabricated according to a second embodiment of the present invention and a first comparison example.

FIG. 3 is an enlarged sectional view of a pixel region in an organic light emitting display apparatus showing a second embodiment of the present invention. An Al—Nd film having a thickness of 150 nm is formed on a planarized layer 136 by using the sputtering method. A first electrode 115 is formed using the photolithography method. Subsequently, three SiNx layers differing in film quality are formed as an insulation film bank 120 by using the PECVD method while varying the film forming condition. Subsequently, the insulation film bank 120 is formed by dry etching using $CF_4+O_2$ to be regular tapered at an upper part of a slope and reverse tapered at a lower part of the slope. As a result of SEM observation, it is found that the lower part of the slope of the insulation film bank forms a reverse tapered angle of 65 degrees with an exposed lower electrode face and the reverse taper has a height h of 200 nm.

Subsequently, an Al film is formed on the first electrode 115 and the insulation film bank 120 as a metal thin film 127 by 10 nm using the vacuum deposition method. Subsequently, a LiF film is formed on the metal thin film 127 as an electron injection layer 124 by 0.5 nm using the vacuum deposition method. A shadow mask is used to form a pattern. An Alq film having a film thickness of 20 nm is formed on the electron injection layer 124 by using the vacuum deposition method. The Alq film functions as an electron transportation layer 123. A shadow mask is used to form a pattern. On the electron transportation layer 123, a simultaneous deposited film of Alq and quinacridon having a film thickness of 20 nm is formed by using the binary simultaneous vacuum deposition method. Deposition is conducted by exercising control so as to attain a deposition rate of 40:1. The simultaneous deposited film of Alq and quinacridon functions as a light emitting layer 122. A shadow mask is used to form a pattern. Subsequently, an α-NPD film having a film thickness of 50 nm is formed using the vacuum deposition method. A shadow mask is used to form a pattern. The deposition region is determined by increasing each side of the lower electrode by 1.2 times. This α-NPD film functions as a hole transportation layer 121. Subsequently, copper phthalocyanine having a film thickness of 50 nm is formed using the vacuum deposition method. A shadow mask is used to form a pattern. The deposition region is determined by increasing each side of the lower electrode by 1.2 times. This functions as a hole injection layer 129. As for an upper electrode, an In—Zn—O film (hereafter abbreviated to IZO film) having a film thickness of 100 nm is formed using the sputtering method. The IZO film functions as a second electrode 125, and it is an amorphous oxide film. As for a target, a target having In/(In+Zn)=0.83 is used. As for the film forming conditions, $Ar:O_2$ mixed gas is used as an atmosphere, the degree of vacuum is set equal to 0.8 Pa, and the sputtering output is set equal to 0.2 $W/cm^2$. The second electrode 125 formed of the In—ZnO film functions as the anode, and its transmittance is 80%. Subsequently, a SiOxNy film having a film thickness of 50 nm is formed using the sputtering method. The SiOxNy film functions as a protection layer 126.

It becomes possible to cut the metal thin film 127 and the electron injection layer 124 every pixel by using the manufacturing method heretofore described. In other words, in the configuration of the present embodiment, the lower part of the insulation film bank having a regular tapered shape is provided with a reverse tapered shape. When forming the metal thin film 127 and the electron injection layer 124, therefore, it becomes possible to cut them at the reverse tapered part.

In addition to the effects obtained in the first embodiment, therefore, it becomes possible to prevent contact between the cathode and the anode and short circuit to an adjacent pixel. Also in a configuration using the first electrode as the anode and the second electrode as the cathode, the present embodiment can be applied in the same way.

First Comparative Example

For comparison with the second embodiment, an organic light emitting display apparatus using a reverse tapered insulation film bank.

FIG. 4 shows results obtained by evaluating the light emitting luminance of the display apparatuses fabricated according to the second embodiment and the first comparative example. A voltage of 7 V is applied to elements in the display apparatus. In the display apparatus according to the second embodiment, the upper part of the slope in the insulation film bank is regular tapered. The lower part of the slope is reverse tapered. An angle θ formed by the lower part of the slope with the exposed lower electrode face is a reverse tapered angle of 65 degrees. The reversed taper has a height h of 100 nm. And the metal thin film is an Al film and has a film thickness of 10 nm. It is found that the display apparatus according to the second embodiment has light emitting luminance as high as 1500 cd/m$^2$. Crosstalk with adjacent pixels is not found. The metal thin film is an Al film having a film thickness of 10 nm. Although the light emitting luminance falls to 700 cd/m$^2$, crosstalk is recognized. Although the effect of the metal thin film is recognized, crosstalk occurs because the metal thin film is not divided every pixel.

Third Embodiment

Figure 5:
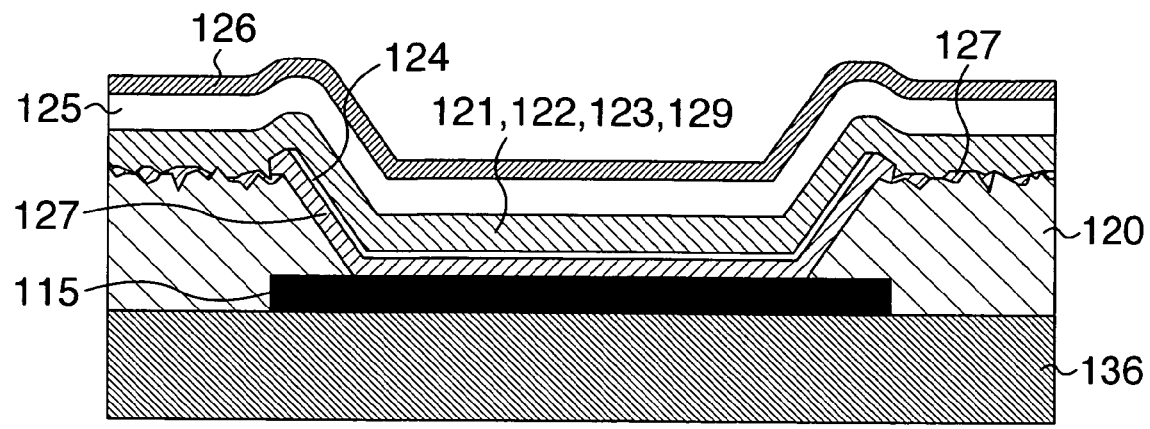
FIG. 5 is an enlarged sectional view of a pixel region in an organic light emitting display apparatus showing a third embodiment of the present invention.

A third embodiment of the present invention will now be described with reference to FIG. 5.

In the present embodiment, another means for making the metal thin film discontinuous is used. Hereafter, a manufacturing method for an organic light emitting display apparatus according to this embodiment will be described. A thin film transistor is an amorphous silicon thin film transistor. FIG. 5 is an enlarged sectional view of a pixel region in the organic light emitting apparatus showing the second embodiment of the present invention. A Cr film having a film thickness of 200 nm is formed on a glass substrate as a gate electrode by using the sputtering method. Thereafter, the Cr film is worked to form gate wiring by using the photolithography method. Thereon, a SiNx film having a film thickness of 300 nm is formed as a gate insulation layer by using the PECVD method. Subsequently, an a-Si film having a film thickness of 200 nm is formed as a semiconductor layer by using the PECVD method. At the same time, an n+Si film having a film thickness of 30 nm is formed as a contact layer by using the PECVD method. Subsequently, the semiconductor layer is worked to take the shape of an island by using the photolithography method. Subsequently, a CrMo film having a film thickness of 200 nm formed by using the sputtering method is worked to form source and drain electrode wiring by using the photolithography method. An n+Si film existing between the source and drain electrodes is etched. On the n+Si film, a SiNx film having a film thickness of 500 nm is formed as a protection layer by using the PECVD method. In addition, through holes are formed through the protection layer by using the photolithography method. Subsequently, an Al—Nd film having a thickness of 150 nm is formed using the sputtering method, and a first electrode 115 is formed using the photolithography method.

Subsequently, a positive type photosensitive protection film (PC452) made by JSR corporation is formed as an insulation film bank 120 by using the spin coat method, and baking processing is conducted.

The insulation film bank 120 formed of PC452 has a film thickness of 1 μm. The insulation film bank 120 covers edges of the first electrode 115 by 3 μm. Subsequently, the top of the insulation film bank 120 is provided with a subtle uneven shape by using plasma etching as observed using an SEM.

Subsequently, an Al film is formed on the first electrode 115 and the insulation film bank 120 as a metal thin film 127 so as to have a thickness of 10 nm by using the vacuum deposition method.

Subsequently, a LiF film is formed on the metal thin film 127 as an electron injection layer 124 so as to have a thickness of 0.5 nm by using the vacuum deposition method. A shadow mask is used to form a pattern.

An Alq film having a film thickness of 20 nm is formed on the electron injection layer 124 by using the vacuum deposition method. The Alq film functions as an electron transportation layer 123. A shadow mask is used to form a pattern. On the electron transportation layer 123, a simultaneous deposited film of Alq and quinacridon having a film thickness of 20 nm is formed by using the binary simultaneous vacuum deposition method. Deposition is conducted by exercising control so as to attain a deposition rate of 40:1. The simultaneous deposited film of Alq and quinacridon functions as a light emitting layer 122. A shadow mask is used to form a pattern.

Subsequently, an α-NPD film having a film thickness of 50 nm is formed using the vacuum deposition method. A shadow mask is used to form a pattern. The deposition region is determined by increasing each side of the lower electrode by 1.2 times. This α-NPD film functions as a hole transportation layer 121.

Subsequently, copper phthalocyanine having a film thickness of 50 nm is formed using the vacuum deposition method. A shadow mask is used to form a pattern. The deposition region is determined by increasing each side of the lower electrode by 1.2 times. This functions as a hole injection layer 129.

As for an upper electrode, an IZO film having a film thickness of 100 nm is formed using the sputtering method. The IZO film functions as a second electrode 125, and it is an amorphous oxide film. As for a target, a target having In/(In+Zn)=0.83 is used. As for the film forming conditions, Ar:O$_2$ mixed gas is used as an atmosphere, the degree of vacuum is set equal to 1 Pa, and the sputtering output is set equal to 0.2 W/cm$^2$. The second electrode 125 formed of the In—ZnO film functions as the anode, and its transmittance is 80%.

Subsequently, a SiOxNy film having a film thickness of 50 nm is formed using the sputtering method. The SiOxNy film functions as a protection layer 126.

Figure 10:
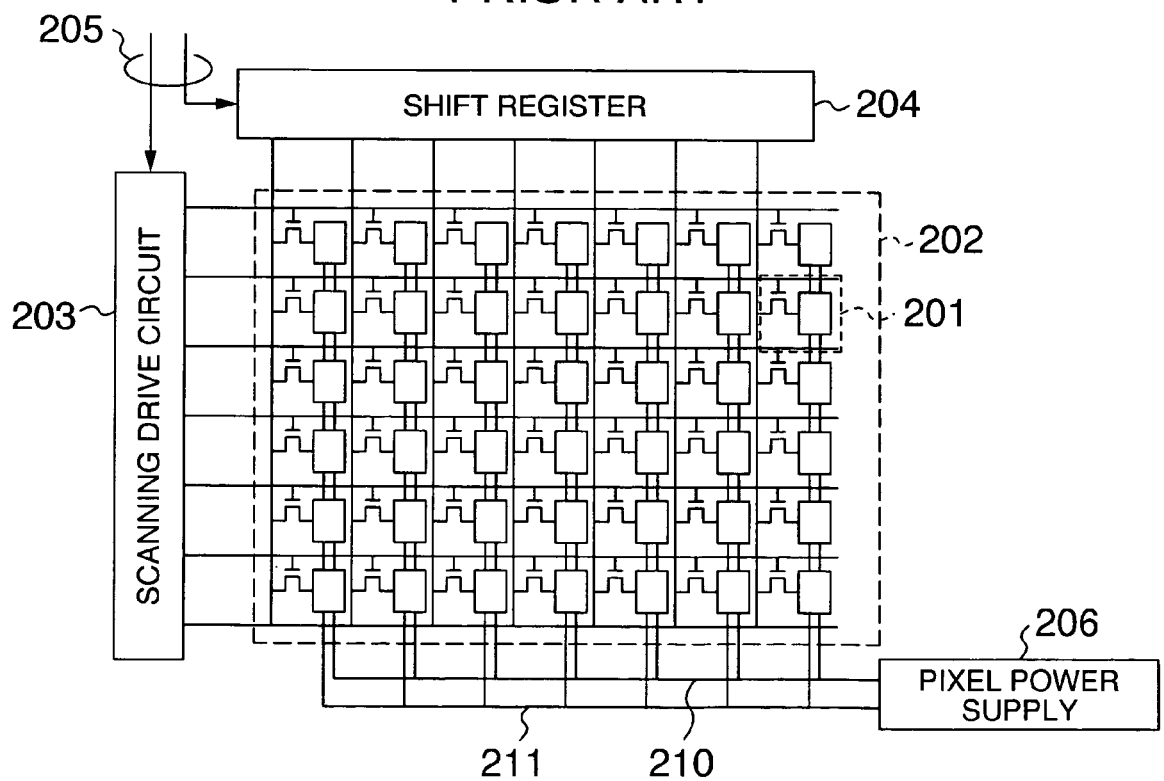
FIG. 10 is a configuration diagram of an organic light emitting display apparatus.

A panel is manufactured by way of trial as shown in FIG. 10. Pixels 201 each incorporating a memory cell are arranged to form a display region 202. In order to drive a matrix, a shift register 204 is connected to data wiring and a scanning drive circuit 203 is connected to scanning wiring. A control signal for controlling the driving of these circuits and display data are supplied via input wiring 205. Furthermore, EL power supply wiring 210 and EL common wiring 211 of the pixels are collectively connected to a pixel power supply 206.

It becomes possible to cut the metal thin film 127 every pixel by using the configuration heretofore described. In other words, in the configuration of the present embodiment, the insulation film bank 120 is provided with an uneven structure. As a result, it becomes possible to cut the metal thin film 127.

Light emitting luminance of the display apparatus fabricated according to the third embodiment is evaluated. A voltage of 7 V is applied to elements in the display apparatus. It is found that light emission luminance as high as 1450 cd/m$^2$ is obtained in the display apparatus according to the third embodiment. Crosstalk with adjacent pixels is not found. The top of the insulation film bank has an uneven surface. Therefore, it is found that the metal thin film is divided into pixels even if it is formed so as to have a thickness of 10 nm.

It is ascertained that the current driven by the thin film transistor decreases and the shift of the threshold voltage of the thin film transistor decreases because of prevention of crosstalk between a light emitting part and adjacent pixels and high efficiency.

Fourth Embodiment

Figure 6:
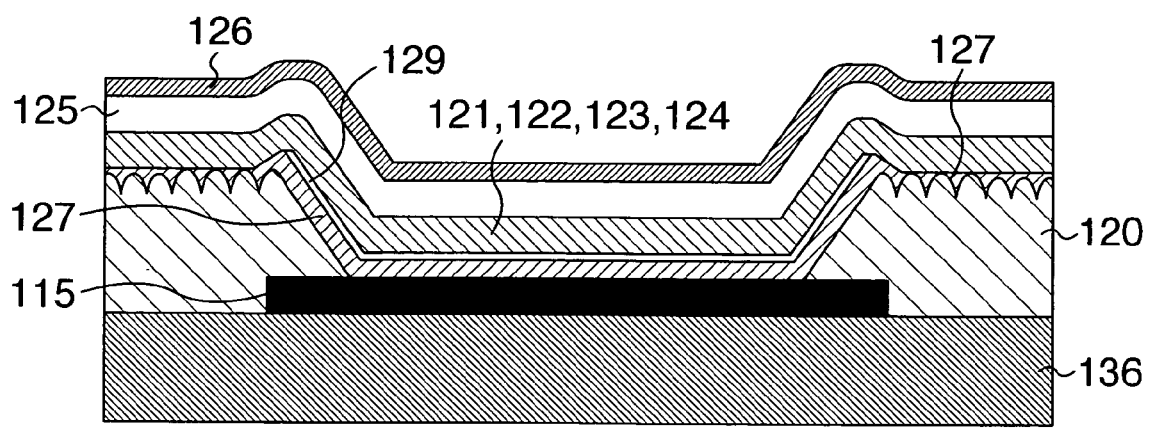
FIG. 6 is an enlarged sectional view of a pixel region in an organic light emitting display apparatus showing a fourth embodiment of the present invention.

A fourth embodiment of the present invention will now be described with reference to FIG. 6.

In a configuration of the present embodiment, a first electrode 115 functions as the anode and a second electrode 125 functions as the cathode.

Hereafter, an organic light emitting display apparatus according to the embodiment of the present invention will be described. FIG. 2 is a sectional view of a pixel region in the organic light emitting display apparatus. The thin film transistor is a polysilicon thin film transistor. FIG. 6 is an enlarged sectional view of a pixel region in an organic light emitting display apparatus showing the fourth embodiment of the present invention. As for a second interlayer insulation film 119, a SiNx film is formed using the chemical vapor deposition method. The film thickness is 500 nm. On the second interlayer insulation film 119, a Cr film having a thickness of 150 nm is formed using the sputtering method. The first electrode 115 is formed using the photolithography method. The first electrode 115 functions as the anode.

Subsequently, a SiNx film is formed as an insulation film bank 120 by using the plasma enhanced chemical vapor deposition method (PECVD method) under a film forming condition for forming a dome-shaped structure. As a result, the top of the insulation film bank 120 is provided with an uneven shape as observed using an SEM.

The insulation film bank 120 formed of SiNx has a film thickness of 0.5 μm. The insulation film bank 120 covers edges of the first electrode 115 by 2 μm.

Subsequently, a Cr film is formed on the first electrode 115 and the insulation film bank 120 as a metal thin film 127 so as to have a thickness of 10 nm by using the sputtering method.

Subsequently, copper phthalocyanine having a film thickness of 50 nm is formed using the vacuum deposition method. A shadow mask is used to form a pattern. The deposition region is determined by increasing each side of the first electrode by 1.2 times. This functions as a hole injection layer 129.

Subsequently, an α-NPD film having a film thickness of 50 nm is formed using the vacuum deposition method. A shadow mask is used to form a pattern. The deposition region is determined by increasing each side of the lower electrode by 1.2 times. This α-NPD film functions as a hole transportation layer 121. On the hole transportation layer 121, a simultaneous deposited film of Alq and quinacridon having a film thickness of 20 nm is formed by using the binary simultaneous vacuum deposition method. Deposition is conducted by exercising control so as to attain a deposition rate of 40:1. The simultaneous deposited film of Alq and quinacridon functions as a light emitting layer 122. A shadow mask is used to form a pattern.

An Alq film having a film thickness of 20 nm is formed on the simultaneous deposited film of Alq and quinacridon by using the vacuum deposition method. The Alq film functions as an electron transportation layer 123. A shadow mask is used to form a pattern.

Subsequently, a LiF film is formed on the metal thin film 127 as an electron injection layer 124 so as to have a thickness of 0.5 nm by using the vacuum deposition method. A shadow mask is used to form a pattern.

On the electron injection layer 124, an IZO film having a thickness of 150 nm is formed using the sputtering method. A second electrode 125 is thus formed. The second electrode 125 functions as the cathode, and it is an amorphous oxide film. As for a target, a target having In/(In+Zn)=0.83 is used. As for the film forming conditions, Ar:O$_2$ mixed gas is used as an atmosphere, the degree of vacuum is set equal to 0.8 Pa, and the sputtering output is set equal to 0.2 W/cm$^2$.

Subsequently, a SiOxNy film having a film thickness of 70 nm is formed using the sputtering method. The SiOxNy film functions as a protection layer 126.

A panel is manufactured by way of trial as shown in FIG. 10. Pixels 201 each incorporating a memory cell are arranged to form a display region 202. In order to drive a matrix, a shift register 204 is connected to data wiring and a scanning drive circuit 203 is connected to scanning wiring. A control signal for controlling the driving of these circuits and display data are supplied via input wiring 205. Furthermore, EL power supply wiring 210 and EL common wiring 211 of the pixels are collectively connected to a pixel power supply 206.

It becomes possible to cut the metal thin film 127 every pixel by using the configuration heretofore described. In other words, in the configuration of the present embodiment, the insulation film bank 120 is provided with an uneven structure. As a result, it becomes possible to cut the metal thin film 127.

Light emitting luminance of the display apparatus fabricated according to the fourth embodiment is evaluated. A voltage of 7 V is applied to elements in the display apparatus. It is found that light emission luminance as high as 1260 cd/m$^2$ is obtained in the display apparatus according to the fourth embodiment. Crosstalk with adjacent pixels is not found. The top of the insulation film bank has an uneven surface. Therefore, it is found that the second electrode is divided into pixels even if it is formed so as to have a thickness of 10 nm.

Owing to the high efficiency in the light emitting part, the pixel voltage becomes low and the reliability of the pixel circuit can be improved. Since the pixel voltage can be made low, the pixel power supply can be small-sized.

Fifth Embodiment

A fifth embodiment of the present invention will now be described (not illustrated). A thin film transistor is an amorphous silicon thin film transistor. The manufacturing method of the thin film transistor is the same as that in the third embodiment. As for a second interlayer insulation film 119, a SiNx film is formed using the chemical vapor deposition method. The film thickness is 500 nm. On the second interlayer insulation film 119, an Al film having a thickness of 150 nm is formed using the sputtering method. A first electrode 115 is formed using the photolithography method.

Subsequently, a positive type photosensitive protection film (PC452) made by JSR corporation is formed as an insulation film bank 120 by using the spin coat method, and baking processing is conducted.

The insulation film bank 120 formed of PC452 has a film thickness of 1 μm. The insulation film bank 120 covers edges of the first electrode 115 by 3 μm.

Subsequently, a Li film is formed on the first electrode 115 and the slope of the insulation film bank 120 as a metal thin film 127 so as to have a thickness of 10 nm by using the vacuum deposition method. A shadow mask is used to form the metal thin film.

Subsequently, a LiF film is formed on the metal thin film 127 as an electron injection layer 124 so as to have a thickness of 0.5 nm by using the vacuum deposition method. A shadow mask is used to form a pattern.

An Alq film having a film thickness of 20 nm is formed on the electron injection layer 124 by using the vacuum deposition method. The Alq film functions as an electron transportation layer 123. A shadow mask is used to form a pattern. On the electron transportation layer 123, a simultaneous deposited film of Alq and quinacridon having a film thickness of 20 nm is formed by using the binary simultaneous vacuum deposition method. Deposition is conducted by exercising control so as to attain a deposition rate of 40:1. The simultaneous deposited film of Alq and quinacridon functions as a light emitting layer 122. A shadow mask is used to form a pattern.

Subsequently, an α-NPD film having a film thickness of 50 nm is formed using the vacuum deposition method. A shadow mask is used to form a pattern. The deposition region is determined by increasing each side of the lower electrode by 1.2 times. This α-NPD film functions as a hole transportation layer 121.

Subsequently, copper phthalocyanine having a film thickness of 50 nm is formed using the vacuum deposition method. A shadow mask is used to form a pattern. The deposition region is determined by increasing each side of the lower electrode by 1.2 times. This functions as a hole injection layer 129.

As for an upper electrode, an IZO film having a film thickness of 100 nm is formed using the sputtering method. The IZO film functions as a second electrode 125, and it is an amorphous oxide film. As for a target, a target having In/(In+Zn)=0.83 is used. As for the film forming conditions, $Ar:O_2$ mixed gas is used as an atmosphere, the degree of vacuum is set equal to 1 Pa, and the sputtering output is set equal to 0.2 $W/cm^2$. The second electrode 125 formed of the In—ZnO film functions as the anode, and its transmittance is 80%.

Subsequently, a SiOxNy film having a film thickness of 50 nm is formed using the sputtering method. The SiOxNy film functions as a protection layer 126.

A panel is manufactured by way of trial as shown in FIG. 10. Pixels 201 each incorporating a memory cell are arranged to form a display region 202. In order to drive a matrix, a shift register 204 is connected to data wiring and a scanning drive circuit 203 is connected to scanning wiring. A control signal for controlling the driving of these circuits and display data are supplied via input wiring 205. Furthermore, EL power supply wiring 210 and EL common wiring 211 of the pixels are collectively connected to a pixel power supply 206.

Light emitting luminance of the display apparatus fabricated according to the fifth embodiment is evaluated. A voltage of 7 V is applied to elements in the display apparatus. It is found that light emission luminance as high as 1520 $cd/m^2$ is obtained in the display apparatus according to the fifth embodiment. Crosstalk with adjacent pixels is not found.

Thus, in the present embodiment, a pattern of the metal thin film 127 is formed using a shadow mask, and a second electrode is prevented from being formed on the insulation film bank. Owing to this configuration, the metal thin film 127 can be divided into pixels. It becomes possible to decrease the current driven by the thin film transistor and the shift of the threshold voltage of the thin film transistor because of prevention of crosstalk between a light emitting part and adjacent pixels and high efficiency.

Sixth Embodiment

A sixth embodiment of the present invention will now be described (not illustrated). The manufacturing method is made similar to that in the second embodiment. A thin film transistor is a polysilicon thin film transistor. As for a second interlayer insulation film 119, a SiNx film is formed using the chemical vapor deposition method. The film thickness is 500 nm. On the second interlayer insulation film 119, an Al film having a thickness of 150 nm is formed using the sputtering method. A first electrode 115 is formed using the photolithography method.

Subsequently, a positive type photosensitive protection film (PC452) made by JSR corporation is formed as an insulation film bank 120 by using the spin coat method, and baking processing is conducted.

The insulation film bank 120 formed of PC452 has a film thickness of 1 μm. The insulation film bank 120 covers edges of the first electrode 115 by 3 μm.

Subsequently, an Al film having the same material as that of the first electrode 115 is formed on the first electrode 115 and the slope of the insulation film bank 120 as a metal thin film 127 so as to have a thickness of 5 nm by using the vacuum deposition method. A shadow mask is used to form a pattern.

Subsequently, a LiF film is formed on the metal thin film 127 as an electron injection layer 124 so as to have a thickness of 0.5 nm by using the vacuum deposition method. A shadow mask is used to form a pattern.

An Alq film having a film thickness of 20 nm is formed on the electron injection layer 124 by using the vacuum deposition method. The Alq film functions as an electron transportation layer 123. A shadow mask is used to form a pattern. On the electron transportation layer 123, a simultaneous deposited film of Alq and quinacridon having a film thickness of 20 nm is formed by using the binary simultaneous vacuum deposition method. Deposition is conducted by exercising control so as to attain a deposition rate of 40:1. The simultaneous deposited film of Alq and quinacridon functions as a light emitting layer 122. A shadow mask is used to form a pattern.

Subsequently, an α-NPD film having a film thickness of 50 nm is formed using the vacuum deposition method. A shadow mask is used to form a pattern. The deposition region is determined by increasing each side of the lower electrode by 1.2 times. This α-NPD film functions as a hole transportation layer 121.

Subsequently, copper phthalocyanine having a film thickness of 50 nm is formed using the vacuum deposition method. A shadow mask is used to form a pattern. The deposition region is determined by increasing each side of the lower electrode by 1.2 times. This functions as a hole injection layer 129.

As for an upper electrode, an IZO film having a film thickness of 100 nm is formed using the sputtering method. The IZO film functions as a second electrode 125, and it is an amorphous oxide film. As for a target, a target having In/(In+Zn)=0.83 is used. As for the film forming conditions, $Ar:O_2$ mixed gas is used as an atmosphere, the degree of vacuum is set equal to 0.8 Pa, and the sputtering output is set equal to 0.2

W/cm². The second electrode 125 formed of the IZO film functions as the anode, and its transmittance is 80%.

Second Comparative Example

Figures 7, 8:
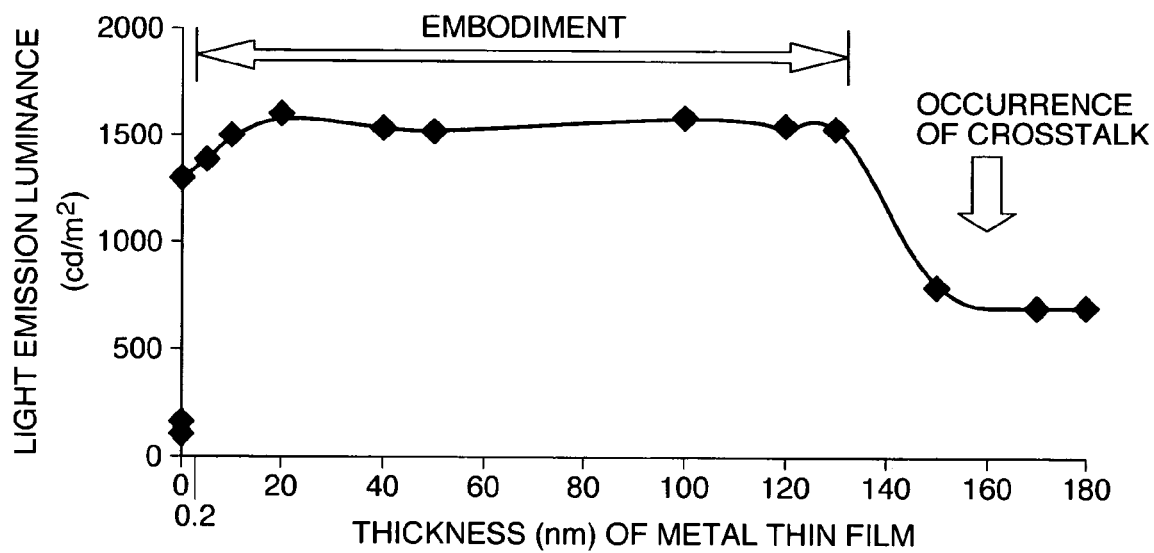
FIG. 7 is a diagram showing dependence of light emission luminance of an element in an organic light emitting apparatus fabricated according to a second embodiment of the present invention upon a film thickness of a metal thin film.
FIG. 8 is a Table showing a result obtained by evaluating light emission luminance of elements in organic light emitting apparatuses fabricated according to a sixth embodiment of the present invention and a second comparison example.

For comparison with the sixth embodiment, an organic light emitting display apparatus that does not use the metal thin film 127 is fabricated. FIG. 7 shows results obtained by evaluating the light emitting luminance of the display apparatuses fabricated according to the sixth embodiment and the second comparative example. A voltage of 7 V is applied to elements in the display apparatus. In the display apparatus according to the sixth embodiment, the metal thin film is an Al film having a film thickness of 5 nm. It is found that the display apparatus according to the sixth embodiment has light emitting luminance as high as 1550 cd/m². The display apparatus according to the second comparative example differs from the display apparatus according to the sixth embodiment in that the metal thin film is not provided. As a result, light cannot be emitted. It is considered that the surface of the first electrode is contaminated by wet etching or the like. It is clarified that the light emission luminance is improved by providing the metal thin film.

Seventh Embodiment

A seventh embodiment of the present invention will now be described (not illustrated). The manufacturing method is made similar to that in the second embodiment. The display apparatus is manufactured by way of trial with different thicknesses of the metal thin film as shown in FIG. 8 in order to find an optimum thickness of the metal thin film. The voltage applied to the elements is 7 V in any case. Elements that are 0.1 nm or less in thickness of the metal thin film do not emit light. It has been found that elements having light emission luminance of at least 1000 cd/m² are in the range of 0.2 to 130 nm in thickness of the metal thin film. In elements that are at least 140 nm in thickness of the metal thin film, the light emission luminance falls and crosstalk occurs. The reason will now be described. The lower part of the slope of the insulation film bank has a reverse taper height of 200 nm. If the thickness of the metal thin film becomes large, therefore, a continuous film is formed on the lower electrode and the insulation film bank.

Eighth Embodiment

An eighth embodiment of the present invention will now be described (not illustrated). The manufacturing method is made similar to that in the second embodiment. The display apparatus is manufactured by way of trial with different thicknesses of the metal thin film in order to find an optimum thickness of the metal thin film. The voltage applied to the elements is 7 V in any case. It has been found that the light emission luminance is at least 1000 cd/m² and crosstalk does not occur in elements having a thickness of the metal thin film that is half or less of center line average roughness of the top surface of the insulation film bank. In elements having a thickness of the metal thin film that is at least half of center line average roughness of the top surface of the insulation film bank, the light emission luminance falls and crosstalk occurs. The reason is that the metal thin film is not divided every pixel provided that the thickness becomes large.

Ninth Embodiment

A ninth embodiment of the present invention will now be described (not illustrated). The manufacturing method is made similar to that in the second embodiment. The display apparatus is manufactured by way of trial with different thicknesses of the metal thin film in order to find an optimum thickness of the metal thin film. The voltage applied to the elements is 7 V in any case. It has been found that the light emission luminance is at least 1000 cd/m² and crosstalk does not occur in elements having a thickness of the metal thin film that is half or less of the height of a convex part taking a shape of a cone, a pyramid, a dome, a column or a pillar on the top surface of the insulation film bank. In elements having a thickness of the metal thin film that is at least half of the height of a convex part taking a shape of a cone, a pyramid, a dome, a column or a pillar on the top surface of the insulation film bank, the light emission luminance falls and crosstalk occurs. The reason is that the metal thin film is not divided every pixel provided that the thickness becomes large.

Tenth Embodiment

A tenth embodiment of the present invention will now be described (not illustrated).

A thin film transistor is an amorphous silicon thin film transistor. The manufacturing method of the thin film transistor is the same as that in the third embodiment. As for a second interlayer insulation film 119, a SiNx film is formed using the chemical vapor deposition method. The film thickness is 500 nm. On the second interlayer insulation film 119, an Al film having a thickness of 150 nm is formed using the sputtering method. A first electrode 115 is formed using the photolithography method.

Subsequently, a positive type photosensitive protection film (PC452) made by JSR corporation is formed as an insulation film bank 120 by using the spin coat method, and baking processing is conducted.

The insulation film bank 120 formed of PC452 has a film thickness of 1 μm. The insulation film bank 120 covers edges of the first electrode 115 by 3 μm.

Subsequently, an Al film is formed on the first electrode 115 and the slope of the insulation film bank 120 as a metal thin film 127 so as to have a thickness of 10 nm by using the vacuum deposition method. Subsequently, the Al film formed on the slope of the insulation film bank 120 as the metal thin film 127 is cut using a laser.

Subsequently, a LiF film is formed on the metal thin film 127 as an electron injection layer 124 so as to have a thickness of 0.5 nm by using the vacuum deposition method. A shadow mask is used to form a pattern.

An Alq film having a film thickness of 20 nm is formed on the electron injection layer 124 by using the vacuum deposition method. The Alq film functions as an electron transportation layer 123. A shadow mask is used to form a pattern. On the electron transportation layer 123, a simultaneous deposited film of Alq and quinacridon having a film thickness of 20 nm is formed by using the binary simultaneous vacuum deposition method. Deposition is conducted by exercising control so as to attain a deposition rate of 40:1. The simultaneous deposited film of Alq and quinacridon functions as a light emitting layer 122. A shadow mask is used to form a pattern.

Subsequently, an α-NPD film having a film thickness of 50 nm is formed using the vacuum deposition method. A shadow mask is used to form a pattern. The deposition region is determined by increasing each side of the lower electrode by 1.2 times. This α-NPD film functions as a hole transportation layer 121.

Subsequently, copper phthalocyanine having a film thickness of 50 nm is formed using the vacuum deposition method. A shadow mask is used to form a pattern. The deposition region is determined by increasing each side of the lower electrode by 1.2 times. This functions as a hole injection layer 129.

As for an upper electrode, an IZO film having a film thickness of 100 nm is formed using the sputtering method. The IZO film functions as a second electrode 125, and it is an amorphous oxide film. As for a target, a target having In/(In+Zn)=0.83 is used. As for the film forming conditions, Ar:$O_2$ mixed gas is used as an atmosphere, the degree of vacuum is set equal to 1 Pa, and the sputtering output is set equal to 0.2 W/$cm^2$. The second electrode 125 formed of the In—ZnO film functions as the anode, and its transmittance is 80%.

Subsequently, a SiOxNy film having a film thickness of 50 nm is formed using the sputtering method. The SiOxNy film functions as a protection layer 126.

A panel is manufactured by way of trial as shown in FIG. 10. Pixels 201 each incorporating a memory cell are arranged to form a display region 202. In order to drive a matrix, a shift register 204 is connected to data wiring and a scanning drive circuit 203 is connected to scanning wiring. A control signal for controlling the driving of these circuits and display data are supplied via input wiring 205. Furthermore, EL power supply wiring 210 and EL common wiring 211 of the pixels are collectively connected to a pixel power supply 206.

Thus, in the present embodiment, the metal thin film 127 is cut using the laser. Therefore, it becomes possible to decrease the current driven by the thin film transistor and the shift of the threshold voltage of the thin film transistor because of prevention of crosstalk between a light emitting part and adjacent pixels and high efficiency.

Eleventh Embodiment

An eleventh embodiment of the present invention will now be described (not illustrated).

A thin film transistor is an amorphous silicon thin film transistor. The manufacturing method of the thin film transistor is the same as that in the third embodiment. As for a second interlayer insulation film 119, a SiNx film is formed using the chemical vapor deposition method. The film thickness is 500 nm. On the second interlayer insulation film 119, an Al film having a thickness of 150 nm is formed using the sputtering method. A first electrode 115 is formed using the photolithography method.

Subsequently, a positive type photosensitive protection film (PC452) made by JSR corporation is formed as an insulation film bank 120 by using the spin coat method, and baking processing is conducted. The insulation film bank 120 formed of PC452 has a film thickness of 1 μm. The insulation film bank 120 covers edges of the first electrode 115 by 3 μm.

Subsequently, an Al film is formed on the first electrode 115 and the slope of the insulation film bank 120 as a metal thin film 127 so as to have a thickness of 10 nm by using the vacuum deposition method. Subsequently, the Al film formed on the slope of the insulation film bank 120 as the metal thin film 127 is cut using an electron beam.

Subsequently, a LiF film is formed on the metal thin film 127 as an electron injection layer 124 so as to have a thickness of 0.5 nm by using the vacuum deposition method. A shadow mask is used to form a pattern.

An Alq film having a film thickness of 20 nm is formed on the electron injection layer 124 by using the vacuum deposition method. The Alq film functions as an electron transportation layer 123. A shadow mask is used to form a pattern. On the electron transportation layer 123, a simultaneous deposited film of Alq and quinacridon having a film thickness of 20 nm is formed by using the binary simultaneous vacuum deposition method. Deposition is conducted by exercising control so as to attain a deposition rate of 40:1. The simultaneous deposited film of Alq and quinacridon functions as a light emitting layer 122. A shadow mask is used to form a pattern.

Subsequently, an α-NPD film having a film thickness of 50 nm is formed using the vacuum deposition method. A shadow mask is used to form a pattern. The deposition region is determined by increasing each side of the lower electrode by 1.2 times. This α-NPD film functions as a hole transportation layer 121.

Subsequently, copper phthalocyanine having a film thickness of 50 nm is formed using the vacuum deposition method. A shadow mask is used to form a pattern. The deposition region is determined by increasing each side of the lower electrode by 1.2 times. This functions as a hole injection layer 129.

As for an upper electrode, an IZO film having a film thickness of 100 nm is formed using the sputtering method. The IZO film functions as a second electrode 125, and it is an amorphous oxide film. As for a target, a target having In/(In+Zn)=0.83 is used. As for the film forming conditions, Ar:$O_2$ mixed gas is used as an atmosphere, the degree of vacuum is set equal to 1 Pa, and the sputtering output is set equal to 0.2 W/$cm^2$. The second electrode 125 formed of the In—ZnO film functions as the anode, and its transmittance is 80%.

Subsequently, a SiOxNy film having a film thickness of 50 nm is formed using the sputtering method. The SiOxNy film functions as a protection layer 126.

A panel is manufactured by way of trial as shown in FIG. 10. Pixels 201 each incorporating a memory cell are arranged to form a display region 202. In order to drive a matrix, a shift register 204 is connected to data wiring and a scanning drive circuit 203 is connected to scanning wiring. A control signal for controlling the driving of these circuits and display data are supplied via input wiring 205. Furthermore, EL power supply wiring 210 and EL common wiring 211 of the pixels are collectively connected to a pixel power supply 206.

Thus, in the present embodiment, the metal thin film 127 is cut using the electron beam. Therefore, it becomes possible to decrease the current driven by the thin film transistor and the shift of the threshold voltage of the thin film transistor because of prevention of crosstalk between a light emitting part and adjacent pixels and high efficiency.

It becomes possible to implement a highly efficient thin light emitting display apparatus by using the present invention. The light emitting display apparatus according to the present invention can be utilized as a display apparatus in TV sets and various information terminals.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An organic light emitting display apparatus comprising:
   a substrate;
   a first electrode;
   an insulation film bank formed so as to cover edges of said first electrode;
   a metal thin film formed on said first electrode and said insulation film bank;
   an organic light emitting layer; and
   a second electrode, disposed in the recited order;
   wherein a side face of said insulation film bank comprises a regular tapered part and a reverse tapered shape.

2. An organic light emitting display apparatus according to claim 1, wherein the side face of said insulation film bank has a reverse tapered shape on a side located near said first electrode and has a regular tapered shape on a side located far from said first electrode.

3. An organic light emitting display apparatus according to claim 2, wherein the side face having the reverse tapered shape is at a height in a range of 0.3 to 200 nm from said first electrode.

4. An organic light emitting display apparatus according to claim 2, wherein a film thickness of said metal thin film is equal to two thirds or less of a height of the side face having the reverse tapered shape measured from said first electrode.

5. An organic light emitting display apparatus according to claim 1, further comprising a plurality of pixels and thin film transistors for driving the pixels, wherein the organic light emitting display apparatus is active matrix type.

6. An organic light emitting display apparatus according to claim 5, wherein the thin film transistors are polysilicon thin film transistors or amorphous silicon thin film transistors.

* * * * *